United States Patent [19]
Jamieson

[11] Patent Number: 5,488,300
[45] Date of Patent: Jan. 30, 1996

[54] METHOD AND APPARATUS FOR MONITORING THE STATE OF CHARGE OF A BATTERY

[76] Inventor: Robert S. Jamieson, 40 Misty Meadow Dr., Boynton Beach, Fla. 33462

[21] Appl. No.: 327,350

[22] Filed: Oct. 21, 1994

[51] Int. Cl.$^6$ .................................................. G01N 27/416
[52] U.S. Cl. .......................... 324/432; 324/439; 324/459; 204/406; 204/DIG. 9; 205/789; 205/794.5
[58] Field of Search ...................................... 324/425, 426, 324/432, 439, 459, 693, 713, 722; 204/153.1, 406, DIG. 9; 340/636; 320/48

[56] References Cited

U.S. PATENT DOCUMENTS

| | | | |
|---|---|---|---|
| 3,684,950 | 8/1972 | Nilsson | 324/432 |
| 3,787,754 | 1/1974 | Seabase | 324/432 X |
| 4,129,824 | 12/1978 | Howes | 324/432 |
| 4,506,226 | 3/1985 | Luce et al. | 324/459 |

Primary Examiner—Kenneth A. Wieder
Assistant Examiner—Diep Do
Attorney, Agent, or Firm—Hoffmann & Baron

[57] ABSTRACT

A method of monitoring ion mobility in an electro-conductive fluid, such as an electrolyte in a lead-acid battery to determine the state of charge of the battery, includes the steps of immersing a pair of test electrodes in the electro-conductive fluid, and generating a test signal having a pulsed waveform. The pulsed waveform of the test signal has a voltage which remains constant over a predetermined portion of the signal's period, that portion being selected to ensure that ion mobility in the electro-conductive fluid has reached a steady state velocity. The method further includes the steps of applying the test signal to the pair of test electrodes to cause a current to flow through the test electrodes and the electro-conductive fluid, and sensing the current flow through the test electrodes and fluid. The sensed current is indicative of ion mobility in the electro-conductive fluid.

8 Claims, 6 Drawing Sheets

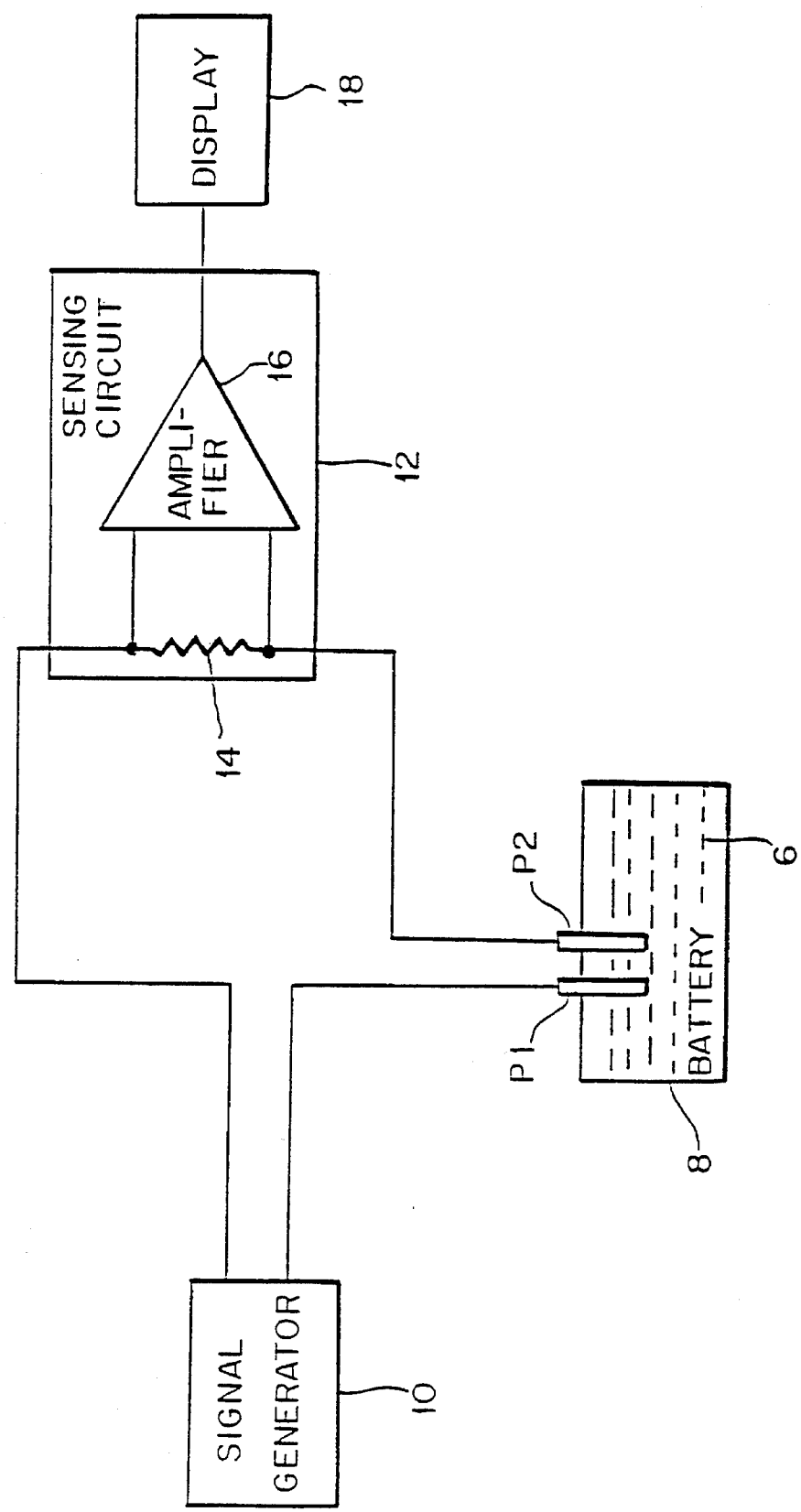

METHOD AND APPARATUS FOR MONITORING THE STATE OF CHARGE OF A BATTERY

BACKGROUND OF THE INVENTION

1. Field of the Invention

This invention relates generally to methods and apparatus for monitoring electro-conductive fluids, and more specifically relates to electronic circuits and methods for monitoring electro-conductive fluids in process control and the electrolyte in batteries to determine the state of charge of the batteries.

2. Description of the Prior Art

There is a continuing need for accurate instruments capable of monitoring the state of charge of batteries, especially for batteries used in electric vehicles. The conventional approach used in monitoring starter batteries in engine driven vehicles cannot yield the accuracy required to inform the operator of the state of charge of batteries, for battery terminal voltages are not representative of battery charge until the battery has rested for about twenty four hours after being charged or discharged.

The common method of ascertaining battery health by using a hygrometer to determine the specific gravity of the electrolyte is not readily useful for continuous monitoring. A motorist concerned about reaching his destination in an electric car will not want to stop periodically to employ a hygrometer. Further, were a method of continuous measurement of specific gravity to be found, the specific gravity readings would only furnish a useful approximation of remaining charge within a narrow range of temperatures close to the standard of 25 degrees Celsius, even when temperature compensation of the hygrometer readings was applied.

Lead-acid battery specifications typically state the number of engine cranking amperes available for a specified period in minutes, at warm and cold temperatures, and reveal that cranking power available at cold temperatures is only a fraction of that available at warm temperatures for the same fully charged battery. The motorist attempting to start his engine in cold weather may only have the ability to obtain 40 percent of warm weather starting current, yet his hygrometer will show a very high specific gravity.

Conventional battery chargers are controlled by time and/or voltage considerations; no direct measure of actual charge is made. The best chargers approximate the Peukert charging algorithm, charging commonly in three, or twelve, steps by controlling charging current and voltage, within certain time constraints. Yet even these continual chargers do not directly measure actual electrolyte condition.

In laboratories, in an attempt to ascertain state of charge, Coulomb cells are occasionally employed. In these cells, a portion of battery charge and discharge currents is routed through the cell, which deposits or removes silver along the glass walls of the cell, thus providing a visual approximation of net charge. However, this instrument ignores the loss in charge caused by recharge inefficiency. One electronic system designed for marine use employs this same general approach. It integrates charge and discharge currents over time, applying a general recharge efficiency correction factor to the recharge current to yield a better approximation in remaining ampere-hours. Again, no direct measurement of actual recharge attained is attempted with this system. Other long-established analytical techniques common to laboratories, such as spectral analysis, are not well-suited to continuous monitoring of battery acid or other electrolytic fluids.

Battery power available at any moment is directly proportional to the concentration of ions in battery electrolyte at that moment. Direct measurement of ion concentration by direct, electrical means yields the best measure of battery capability at that moment. Battery electrolytes, by their very nature, must conduct electrical currents, including those currents superimposed by test instrumentation. Thus, under the action of an impressed test voltage, the resulting flow of ions and electrons is readily measured and is directly related to the density of the available charge carriers, i.e., the electrons and ions.

Howes, in U.S. Pat. No. 4,129,824, teaches the measurement of cell conductivity in a lead-acid battery using an alternating current sinusoidal waveform impressed upon two electrodes immersed in the battery electrolyte. The resulting current is sent through a fixed resistance. The voltage across that resistance is rectified by a diode, filtered to provide a steady voltage and compared to a direct current reference voltage by a differential amplifier. Howes teaches the use of a thermistor temperature sensor in his measuring probe in order to compensate for the thermal change in cell resistivity due to temperature by using a portion of the thermistor's voltage as part of the reference voltage divider string. The resulting output voltage is expressed as specific gravity. Any vehicle operator attempting to relate the output of Howes' apparatus to charge remaining on the battery will be only vaguely informed of the remaining life of his charge, the distance the vehicle can travel, and the like, especially in cold temperatures. For more precise information, he must refer to battery performance tables and perform complex calculations better left to a microprocessor.

In electrolytes, the ions which are propelled from electrode to electrode by the impressed voltage must move through a viscous medium, for example, through the dilute sulfuric acid solution in lead-acid batteries. As mentioned previously, Howes teaches in U.S. Pat. No. 4,129,824 the use of an alternating current sinusoidal waveform in his battery monitor. Howes uses a half-wave rectification approach. This requires heavy filtering and results in long delays in generating signals used for monitoring the state of charge on the battery. In addition, with sine wave ion propulsion, as taught by Howes, the varying electromotive force may have varying effects on the various components of ion mobility limitations, and steady-state ion flow is not attained during each half cycle.

There is also a continuing need for accurate instruments capable of monitoring electro-conductive fluids in process control. The control of salinity in brine solution—in refrigeration, pickling of vegetables, and in salt water aquariums—is one example. Another example is the control of acid concentration in electroplating tanks or for filling lead-acid batteries. Other examples include control of dilutions and mixtures of acids and alkalis and other chemical compounds. In beverages, both for carbonated and non-carbonated soft drinks and flavored waters, accurate control of the sugar content is required, not only for cost considerations but also for taste and quality control. Being electrolytes, all of these fluids are also well suited to direct electrical measurement of their ionic concentrations.

Modern instrumentation and process control technology relies heavily on digital processing. Thus, it is highly desirable that process control monitoring instruments be highly compatible with digital processing equipment. Analog devices are susceptible to thermally-induced changes in gain; direct-current analog devices are also susceptible to drifts in offset voltages or currents, zero levels, and the like. Hence, there is a need for monitoring instruments which are compatible with microprocessors, and which employ digital techniques to the maximum practical extent.

OBJECTS AND SUMMARY OF THE INVENTION

It is an object of the present invention to provide a method and apparatus for accurately monitoring electro-conductive fluids in process control.

It is another object of the present invention to provide a method and apparatus for accurately monitoring the state of charge of a battery.

It is a further object of the present invention to provide a method and apparatus for monitoring electro-conductive fluids generally, and for particularly measuring ion mobility in the electrolyte of a lead-acid battery.

It is yet another object of the present invention to provide a method and apparatus for monitoring in real time and using digital techniques the state of charge of a battery.

It is still a further object of the present invention to provide a method and apparatus for monitoring electro-conductive fluids which overcome the disadvantages of known methods and apparatus.

In accordance with one form of the present invention, a method of monitoring ion mobility in an electro-conductive fluid, such as an electrolyte in a lead-acid battery, includes the steps of immersing at least one pair of test electrodes in the electro-conductive fluid and generating a signal having a periodic pulsed waveform, which is preferably bi-directional and symmetrical. The pulsed waveform has an amplitude which remains constant for a predetermined time period during each cycle of the signal. The method further includes the steps of applying the pulsed waveform signal to the test electrodes such that an electromotive force is impressed across the pair of test electrodes which, in turn, causes a current to flow through the test electrodes and the electro-conductive fluid, and sensing the current flow through the test electrodes caused by the electromotive force. The sensed current flow is indicative of ion mobility in the electro-conductive fluid.

A monitor for monitoring such ion mobility in an electro-conductive fluid, formed in accordance with the present invention, includes at least one pair of test electrodes, which are immersed in the electro-conductive fluid, and a signal generator. The signal generator generates a test signal having a pulsed waveform, the pulsed waveform having an amplitude which remains constant for a predetermined time.

The test signal is applied to the test electrodes such that an electromotive force is impressed across the electrodes. The test electrodes are responsive to the test signal, which causes a current to flow through the test electrodes and the electro-conductive fluid.

The monitor further includes a circuit for sensing the current flow through the test electrodes and the electro-conductive fluid caused by the test signal. The sensed current is indicative of ion mobility in the electro-conductive fluid.

The signal generator may be a bistable or astable multi-vibrator, and may generate a square wave which is applied to the test electrodes.

These and other objects, features and advantages of the present invention will be apparent from the following detailed description of illustrative embodiments thereof, which is to be read in connection with the accompanying drawings.

BRIEF DESCRIPTION OF THE DRAWINGS

FIG. 1 is a block diagram of one form of an electro-conductive fluid monitor formed in accordance with the present invention.

DETAILED DESCRIPTION OF THE PREFERRED EMBODIMENTS

Figure 4:
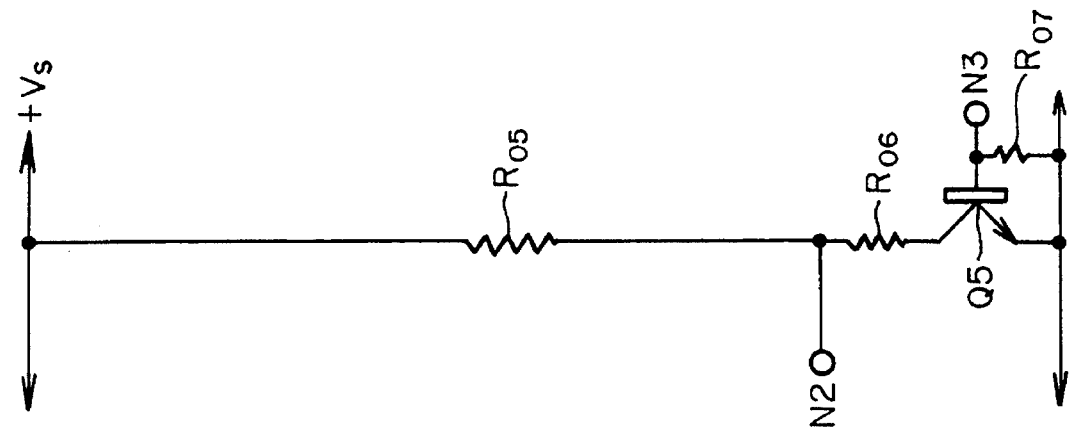
FIG. 4 is a schematic diagram of an electronic circuit for use in conjunction with the electronic circuits shown in FIGS. 2 and 3.

Referring initially to FIG. 1 of the drawings, it can be seen that a monitor for monitoring ion mobility in an electro-conductive fluid, such as an electrolyte in a lead-acid battery, constructed in accordance with the present invention, includes at least one pair of spaced apart test electrodes or probes P1, P2. The test electrodes P1, P2 are at least partially immersed in the electro-conductive fluid.

To facilitate an understanding of the invention, reference in the following description will be made to a monitor which monitors the state of charge of a lead-acid battery, that is, the ion mobility in the electrolyte used in the battery, although it is envisioned that the monitor and method of the present invention are applicable to monitoring ion mobility in other electro-conductive fluids.

Accordingly, the test electrodes P1, P2 are shown in FIG. 1 as being spaced apart and at least partially immersed in an electrolyte 6 of a lead-acid battery 8. The test electrodes may be mounted on the top wall or a side wall of the battery 8, for example, and sealed to the case of the battery to prevent leakage of fluid from the battery.

The test electrodes or probes P1, P2 may be formed from noble metals, such as platinum, gold, graphite, lead or titanium, for example. The electrodes may be formed from other materials, as is well known by one skilled in the art.

The monitor of the present invention also includes a signal generator 10. The signal generator 10 generates a test signal which is applied to the test electrodes P1, P2. The test signal has a periodic pulsed waveform, such as square wave, and, therefore, has an amplitude which remains constant for a predetermined time over a portion of the period of the waveform.

The purpose of having a pulsed waveform, with a constant amplitude over a portion of the waveform, is to ensure that the ions in the electrolyte 6 have attained a steady state velocity in their movement between the test electrodes P1, P2. A sinusoidal waveform, as taught by Howes, is constantly varying and, accordingly, the velocity of the ions in the electrolyte will correspondingly vary at any given point in time. A determination of ion mobility should be made and may be accurately measured after the ions have achieved a steady state, constant velocity. Thus, the test signal is adjusted in pulse width, or in periodicity if it has a 50% duty cycle, so that the constant amplitude portion of each positive and negative going pulse is of sufficient duration to ensure that the ions in the electrolyte have achieved a steady state velocity.

The signal generator 10 may be a voltage generator, and the test signal may be a pulsed voltage signal. This signal is applied to the test electrodes P1, P2 mounted on the battery 8.

The test signal impresses an electromotive force across the electrodes which reverses polarity periodically in accordance with the pulsed test signal. This, in turn, causes a current to flow through the electrodes P1, P2 and the electrolyte 6 of the battery.

The monitor of the present invention includes a sensing circuit 12 for sensing the current flow through the test electrodes P1, P2 and electrolyte 6 of the battery caused by the test signal. This circuit 12 may include, for example, a resistor 14 situated in series with the circuit connecting the signal generator 10 to the test electrodes P1, P2. The sensing circuit 12 will sense the voltage drop across the resistor 14 caused by the current flow through the test electrodes and the electrolyte of the battery 8. The sensed current is indicative of ion mobility in the electrolyte 6 of the battery which, in turn, is indicative of the state of charge of the battery 8. In one form, the sensing circuit 12 may include an amplifier 16 which is coupled to the sensing resistor 14 and whose output drives a display 18 which is effectively responsive to the sensed current and which provides an indication to the user of the monitor as to the state of charge of the battery.

Figure 2:
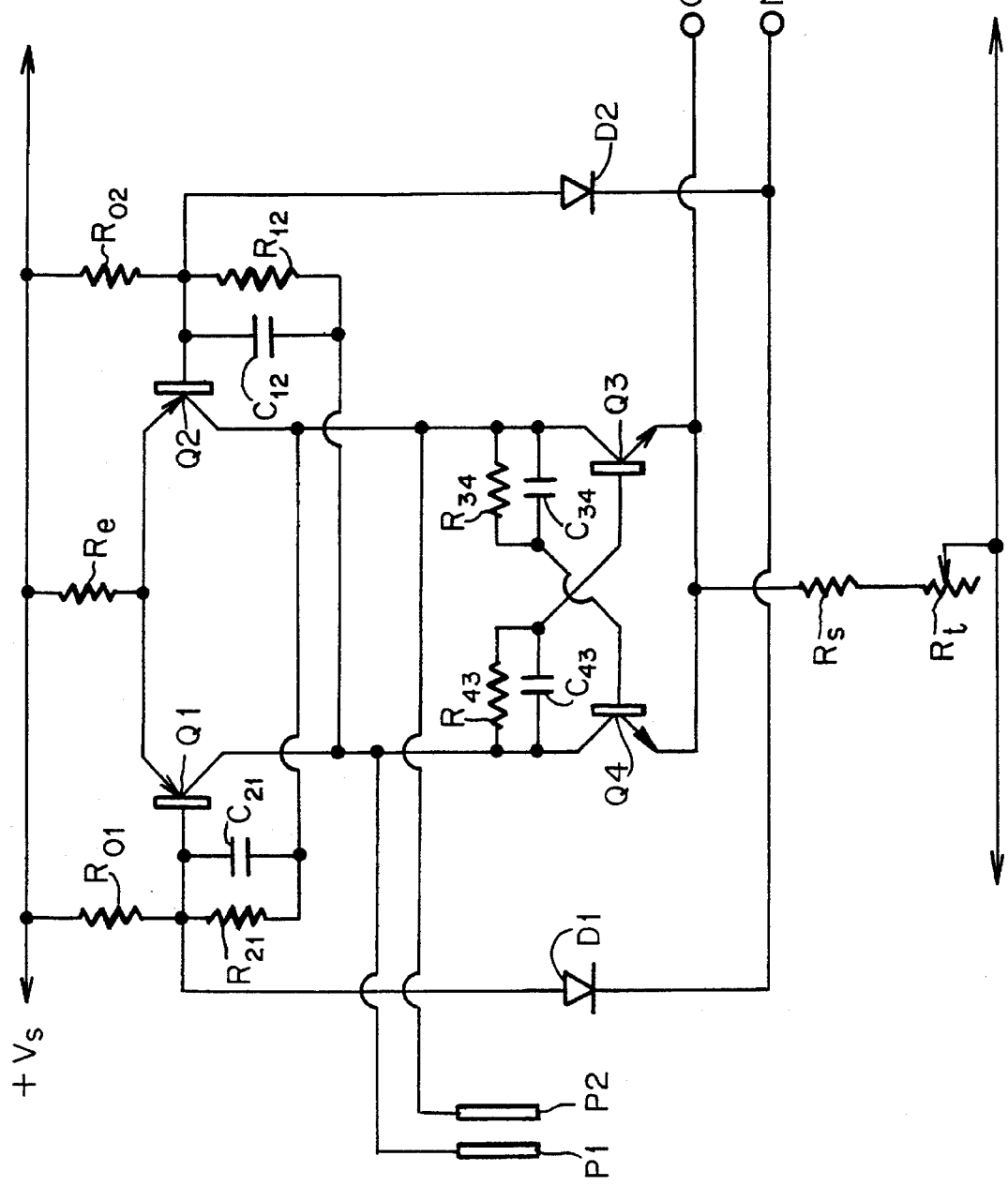
FIG. 2 is a schematic diagram of a portion of an electro-conductive fluid monitor formed in accordance with the present invention.

FIG. 2 illustrates one form of a measuring circuit of the invention, which may be described as a digitally-controlled, recombinant chopper, driven in synchronism by a microprocessor (not shown in FIG. 2, for reasons of simplicity and clarity). Employing a novel bistable circuit, embodied with complementary symmetry transistors, it generates square waves across the probe electrodes submerged in the fluid to be analyzed, in the manner of a chopper, and recombines the resulting square wave currents into a direct-current voltage expressed across the output resistor, i.e., the current sensing resistor.

Transistors Q1 and Q2 are high-gain switching PNP transistors having similar characteristics and sharing the same specifications. Transistors Q3 and Q4 are also high gain switching transistors of the NPN type, and both also have identical specifications. Resistor Re is a shared emitter resistor, which provides a small emitter bias voltage. Resistor Rs and its trimmer, variable resistor Rt, provide a load for the circuit, across which the output voltage appears (i.e., they act as the current sensing resistance). P1 and P2 are the probe electrodes inserted into the electro-conductive fluid whose characteristics are to be measured. Diodes D1 and D2 connect the triggering pulses from the microprocessor (shown in FIG. 6 as circuit U3) via terminal N1 to the bases of transistors Q1 and Q2, to change between the bistable states of the circuit, and thus reverse the polarity of the signal across test electrodes P1 and P2. The remaining resistors, and the capacitors, provide for forward biases of those transistor bases to which they are connected, as will be explained in the detailed explanation of the operation of the circuit to follow.

It is well-known that conductivity measuring electrodes immersed in an electrolyte must use a bipolar test voltage in order to avoid polarization of the electrodes and the formation of gas bubbles at the electrodes, which effectively reduce electrode area. Such test voltages should provide equal currents in both directions; that is, the current-time products of each signal polarity must be equal such that there is no net current to polarize the probes. This requirement is most easily met by having a symmetrical test voltage wave shape, that is, identical positive and negative going pulses. A flip-flop, driven by a pulse train having uniform spacing between pulses, will provide a symmetrical square wave signal. The complementary-symmetry, series-connected dual flip-flops of FIG. 2 not only provide such a test signal, but also synchronously recombine the resulting dual-polarity pulses into a direct current signal, without need of extra rectifier elements or sine wave generators. Further, square wave pulses present a constant electromotive force to the electrolyte during each pulse, in contradistinction to sine waves which present a constantly varying driving force during the pulse. This more closely approximates the use of a steady direct current voltage.

The power supply (not shown), which provides the voltage Vs, may be storage batteries, dry cells, or from rectified alternating power mains, and is connected to the upper and lower horizontal lines in FIG. 2. The legend +Vs indicates the positive power bus. Voltage Vs need not be highly regulated, as will be shown later. Its magnitude is chosen to provide an adequate voltage across both the probes and the output. Since saturation voltage of switching transistors from collector to emitter is commonly 0.2 volts, or less, the series connection of resistors Re, the resistance between electrodes, and Rs and its trimmer, Rt, will account for most of the voltage. It is desirable to set the sum of series resistances of Rs and Rt to be about that of the lowest expected value of resistance of the electrolyte. Thus, changes in electrolyte resistance will be reflected most fully by the output voltage across Rs and Rt. Too large a value of the latter resistances will tend to limit the current through the electrolyte; too small a value will tend to reduce the magnitude of output voltage changes. To the load, that is, the electrolyte, the supply, Vs, is effectively seen through the series resistance comprising the sum of resistors Re, Rs and Rt; hence matching load resistance to source resistance allows for maximum power transfer to the load. Thus it can be seen that the minimum resistance value expected of the electrolyte will determine the values of all other resistors, also including those resistors furnishing base bias currents, taken in consideration with transistor gain. Those base bias resistors must furnish sufficient bias current to ensure that full load current is furnished to the probe electrodes at the minimum electrolyte resistance to be encountered. Trim resistor Rt is used for fine adjustment of the sensing resistance, since it is highly unlikely that standard resistance values would yield the exact value required. For the same reason, resistor Re may also be an adjustable resistor. Since such calculations are well-known in the art, they are not discussed further here, in the interest of brevity.

To better understand circuit operation, assume that transistor Q1 turns on when supply voltage Vs is applied. This connects resistor R43 to a source of current (via resistor Re and transistor Q1) and transistor Q3 is also turned on. Full current now flows through resistor Re, transistor Q1, between the probe electrodes, and through transistor Q3, resistor Rs and trim resistor Rt. The value of resistor Re is chosen to present a small bias to the emitters of transistors Q1 and Q2 such that both transistors Q1 and Q2 cannot conduct simultaneously, as restrained by the voltage divider ratio of resistors R01 and R21, and R02 and R12. This ratio provides just enough forward voltage to saturate its associated transistor against the bias voltage on resistor Re. For a numerical example, if full load current causes a 0.5 volt drop across resistor Re, and the base voltage divider provides 1.2 volts, it will provide the 0.7 volts from base to emitter needed for full saturation. If the second PNP transistor also tried to turn on, the resulting increase in current through resistor Re will increase emitter bias to reduce the base bias available. Further, with transistors Q1 and Q3 conducting, there will be very little voltage available for transistor Q2's base resistors, R02 and R12—in the example given above—with a saturation voltage of 0.2 volts more than the voltage across Re. The portion of that existing across resistor R02 will be too small to provide any forward bias at all; in fact, given proper design, transistor Q2's base will be back-biased. These design principles are well-known in the art, being used in the design of flip-flops and multivibrators for decades.

Similar considerations apply to prevent transistor Q4 from conducting while Q3 is turned on. In fact, with transistor Q3 saturated, resistor R34 is connected to a source of only 0.2 volts, while its value is such that it requires a far higher voltage in order to furnish sufficient bias current to turn transistor Q4 on.

It is to be understood that the above description applies equally to the case wherein transistors Q2 and Q4 are on; full symmetry of gains and base resistor values is maintained.

To change between states, a trigger pulse of sufficient voltage and duration is required. In FIG. 2, if a negative-going pulse is applied to terminal N1, diodes D1 and D2 pull down the bases of both transistors Q1 and Q2 towards zero voltage. If transistor Q1 was previously conducting, with transistor Q2 off, the voltage stored on capacitor C21 will be rather large, its voltage approaching that impressed on electrodes P1 and P2. P1 will have a much higher voltage than P2, approaching Vs, and differing only by the sum of transistor Q1's saturation voltage and emitter bias voltage on resistor Re. The voltage on electrode P2 will approach that on the output (at terminal 01), that is, about Vs. Thus, the voltage on capacitor C12 will be quite small, the voltage being some portion of 0.7 volts in the above numerical example. With the time constants of associated capacitors and resistors being longer than the duration of the trigger pulse, the capacitor voltages will not change appreciably during the trigger pulse. Transistor Q2 is turned on, its base bias current chiefly furnished by the trigger pulse, such that it is not turned off by the increased back bias on resistor Re, during the trigger pulse. Now transistor Q4 is connected to a bias source (Q2's collector) via resistor R34, and it too turns on. When the trigger pulse disappears, the remaining rather large charge on capacitor C21 tends to back bias transistor Q1, impelled by the now higher voltage on the collectors of transistors Q2 and Q3, and transistor Q1 turns off, thus starving off transistor Q3. In like manner, capacitors C43 and C34 act to change the conduction states of transistors Q3 and Q4. Now, with transistors Q2 and Q4 saturated, electrode P2 is almost at the supply voltage, while electrode P1 is at about one half Vs, in the opposite polarity but with equal magnitude to the previous conduction state. Thus, an alternating current of square wave shape is applied to the probe electrodes, being the sum of the two voltages existing from the collectors of transistors Q1 and Q4 to the negative power lead, and from the collectors of transistors Q2 and Q3 to the negative power line (or a common ground for the circuits shown in the figures).

Figure 3:
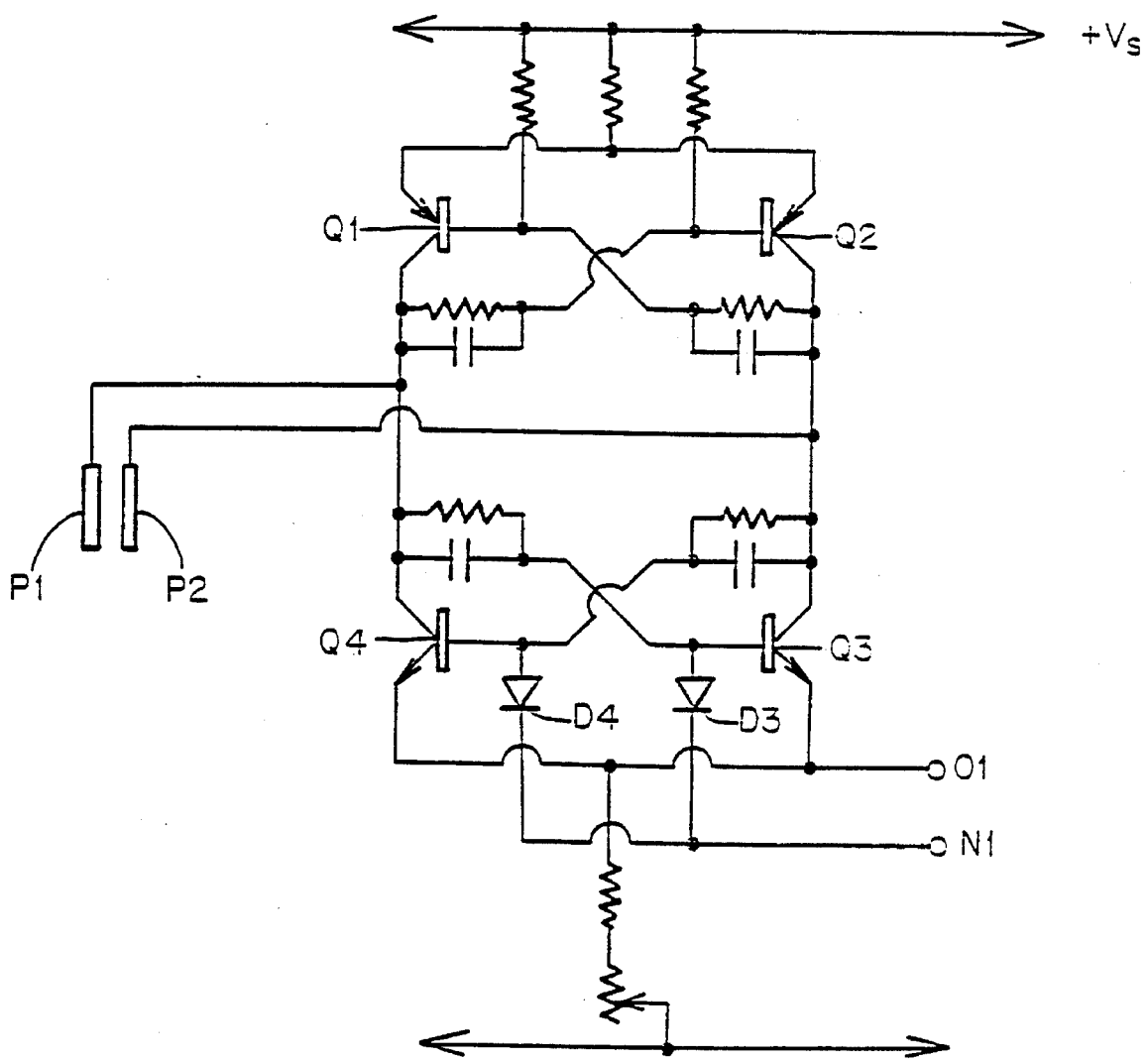
FIG. 3 is a schematic diagram of an alternative embodiment of a portion of an electro-conductive fluid monitor formed in accordance with the present invention.

FIG. 3 illustrates an alternative triggering system. For clarity the designations for all components except transistors and diodes have been omitted, it being understood that all values remain identical to those in FIG. 2. Further, the connections to and between transistors Q1 and Q2 have been redrawn in an arrangement similar to conventional illustrations of flip-flops, and thus more familiar to those well-versed in the art. FIG. 3 thus differs only in the connections of the diodes: the anodes of both are connected to the bases of the lower, NPN transistor pair. The same type of negative-going pulse is applied to terminal N1, and this acts to cut off both transistors Q3 and Q4 momentarily by bringing their bases below the voltage on their emitters. Again, the end of the trigger pulse allows the previously non-conducting transistor to be more favorably biased for turning on, after the trigger pulse, as in the circuit of FIG. 2, because of the difference in voltages stored in capacitors C34 and C43, in a manner familiar to practitioners of the art. Choice of the triggering methods in FIGS. 2 and 3 will rest upon trigger pulse power and the relative gains of the NPN and PNP transistors, circuit wiring capacitances, printed circuit layout considerations, and the like, both circuits otherwise being identical.

The trigger must carry enough energy to cause conduction of two transistors simultaneously, and thus be capable of providing enough bias current while attaining the voltage needed to overcome the rise in emitter back bias caused by simultaneous conduction of both transistors Q1 and Q2. The usual microprocessor is a low power device, especially those employing CMOS technology. Thus some type of pulse driver may be required for those applications monitoring low electrolyte resistances. FIG. 4 illustrates one simple symbolic embodiment of a pulse amplifier. There are many embodiments available and suitable for this purpose. Transistor Q5 is a high gain switching NPN transistor, normally non-conducting, shown symbolically biased off by resistor R07. If connected directly to a microprocessor, this transistor will probably not require bias resistor R07, its base being held down to about 0.2 volts by a saturated transistor in the output of the usual microprocessor. Terminal N3 represents the connection of transistor Q5's base to the microprocessor.

In operation, a positive-going train of pulses periodically turn transistor Q5 on, driving it into saturation. The pulse driver's output, represented by terminal N2, is normally held to a voltage approaching Vs by the relatively large resistance of resistor R05. Since resistor R05's function is to back bias the trigger diodes while transistor Q5 is off, it need only furnish the minute reverse leakage currents of the diodes when back biased. When transistor Q5 is turned on, output N2 is pulled down almost to zero volts, resistor R06 acting to limit current to safe values for the diodes and transistors involved. It should be understood that, in use, terminal N2 of the pulse amplifier circuit is connected to terminal N1 of the circuits shown in FIGS. 2 or 3.)

Figure 5A:
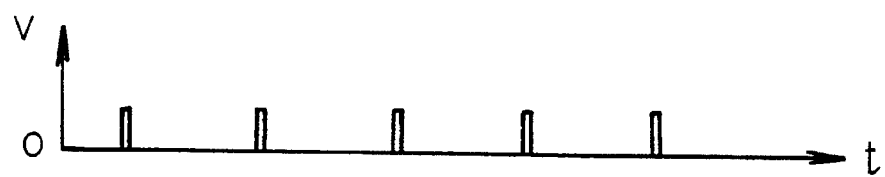
FIGS. 5A–5D are pictorial representations of various waveforms of signals generated by the electronic circuit shown in FIG. 3.
Figure 5B:
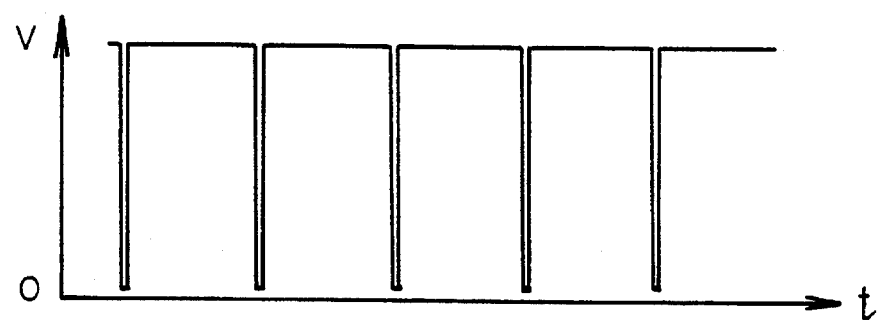
Figure 5C:
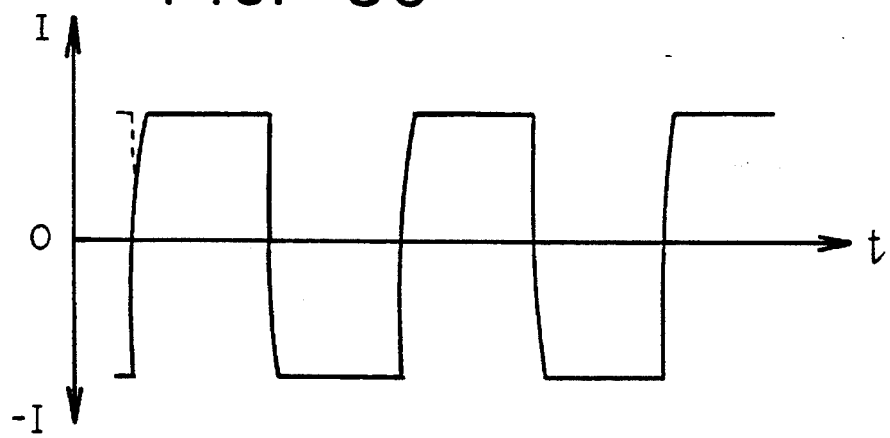
Figure 5D:
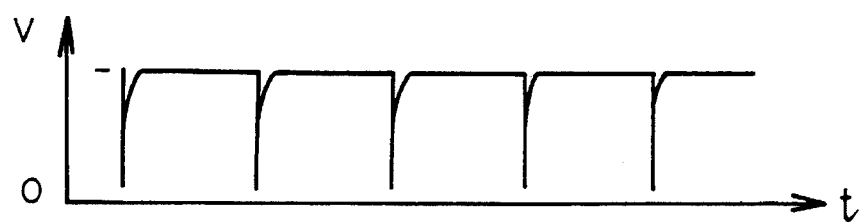

FIGS. 5A–5D illustrate the waveforms involved. FIG. 5A shows the positive-going pulse train produced by the controlling microprocessor. It is convenient and quite practical for this to be a sub-multiple of the microprocessor's internal clock, produced at a lower rate by use of a digital frequency divider or the like. FIG. 5B shows the output signal of the pulse driver, which includes negative-going pulses which drop almost to zero. FIG. 5C illustrates the current waveform flowing between the probe electrodes. Not only are the positive pulses of the same magnitude as the negative pulses, but also their pulse widths are identical. The square wave is generated at a frequency which is one-half the pulse rate, the inevitable result when bistable flip-flops are driven by pulses of uniform rate.

As mentioned previously, in electrolytes, the ions which are propelled from electrode to electrode by the impressed voltage must move through a viscous medium, for example, through the dilute sulfuric acid solution in lead-acid batteries. If the frequency of the square wave is high enough, there will be a slight lag between the beginning of each pulse and the actual flow of current due to limitations on ion mobility. Chemical reactions require time, and ions in a viscous fluid are not capable of infinite acceleration under a finite force. Stated another way, current flow through the electrolyte during the pulse rise and fall times is delayed due to the slower reaction time and inertia of the ions to the change in polarity of the voltages provided to the electrodes. The resulting effect is shown in FIG. 5C. When the pulses are added in resistors Rs and Rt, by alternate conduction of transistors Q3 and Q4, the voltage at the output (on terminal 01) will be of the form shown in FIG. 5D, i.e., a rectified unidirectional voltage. If the square wave voltage has delayed rise time, and the frequency is low enough so that the effects of ion mobility are insignificant, the negative-going gaps shown in the waveform of FIG. 5D will be considerably narrowed. Under such circumstances, little filtering will be required to present a pure DC voltage.

This is in contradistinction to the conventional use of sine waves, as typified by Howes and usual in the art. Heavy filtering must be used when rectifying sine waves, especially when Howes' half-wave rectification approach is used. This results in long delays in signals. In addition, with sine wave ion propulsion, the varying electromotive force may have varying affects on the various components of ion mobility limitations, and steady-state ion flow is not attained during each half cycle. The minimal filtering needed for square waves produces useful signals more rapidly, a feature which may be valuable in certain high flow rate processes, such as the production of beverages in bottling plants. In fact, if sampling is used to measure the output voltage of this invention, no filtering is required. The only requirement would be that the sample is taken after the rise time has expired and during the steady state of current flow, which is an easy task when a microprocessor is involved, for both delayed sampling and triggering can be controlled by the microprocessor clock.

Figure 6:
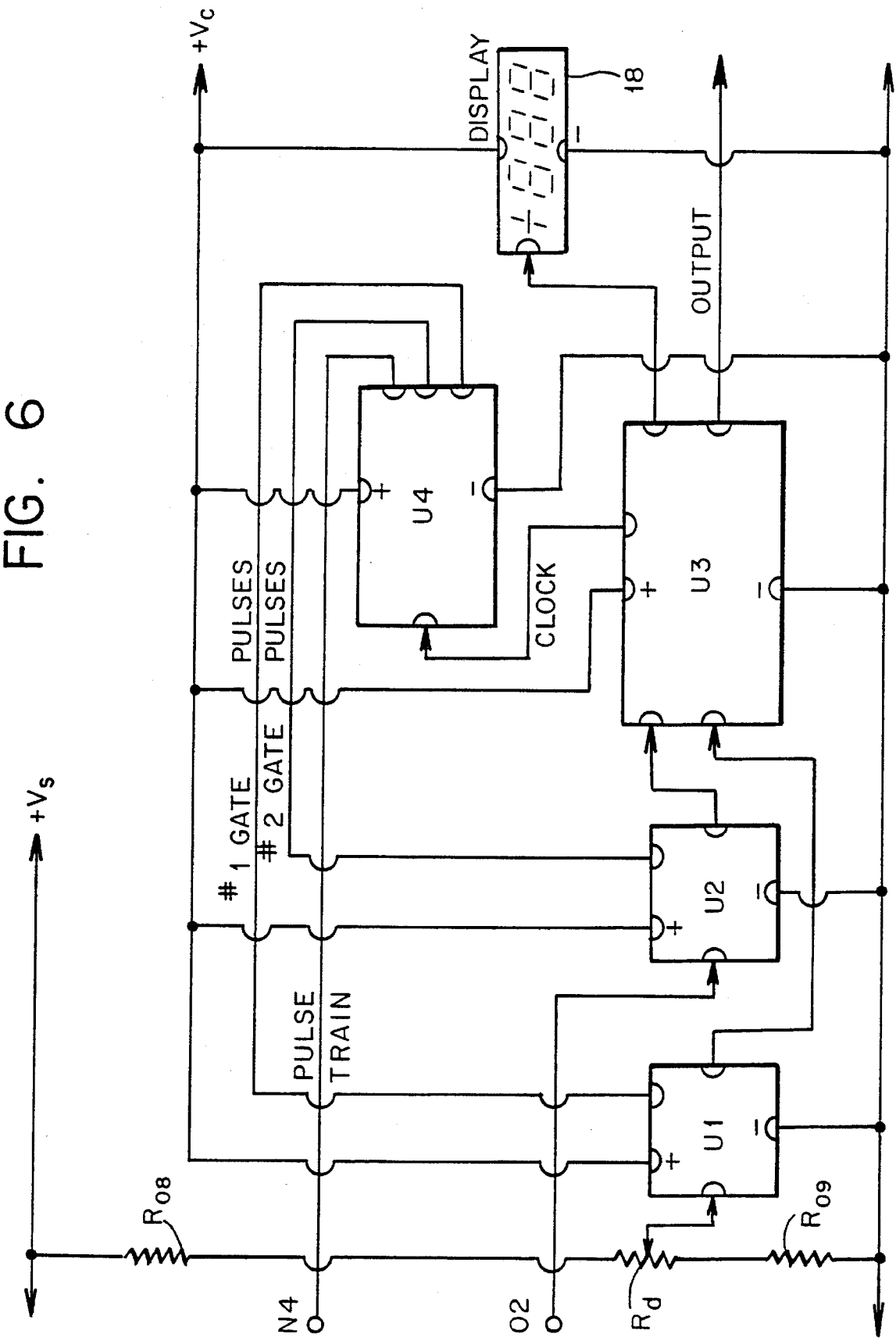
FIG. 6 is a block diagram of another portion of an electro-conductive fluid monitor formed in accordance with the present invention.

FIG. 6 represents a signal conditioning circuit which is used in the preferred embodiment of the invention. Discrete integrated elements are shown; however, it should be understood that all such elements may occupy the same package in a dedicated, special-purpose microprocessor assembly, with the probable exception of the display module.

A second power supply is implied but not shown, its positive bus being indicated by +Vc. Many integrated circuits require a low supply voltage, usually 5.0 volts or less; this may be too low for use in supplying the circuits of FIGS. 2 through 4, especially when electrolyte resistance is low, and/or when probe voltage is high. In other cases, supply voltage Vs would be the same as supply voltage Vc. The lowest horizontal line shown in FIG. 6 represents the negative lead (or ground) common to both supplies. Supply Vc may be simply regulated by means of a shunt Zener diode, or other means known in the art.

Resistors R08, Rd and R09 form a voltage divider across supply Vs. Potentiometer Rd is set to a voltage representative of a value of battery state of charge. For example, potentiometer Rd may be set to represent full charge, that is, it would be set to that output voltage which the recombinant chopper circuit would generate when the probe electrodes are immersed in a fully charged cell. As the battery discharges, its ion concentration decreases, probe resistance increases and the output voltage of the chopper decreases. The difference between the reference voltage and the output voltage is indicative of the charge depletion which has occurred. Alternatively, if the reference voltage divider is set to that lower voltage which represents an exhausted battery, the difference would then represent charge remaining.

In process control applications, potentiometer Rd is used for setting the reference voltage analogous to the desired quality under control. In the case of beverage processing, this potentiometer is set to yield a voltage representing the desired brix value of sugar in the beverage, which brix value, if obtained, would cause an identical voltage to appear on output 01. Higher brix readings would cause the output voltage to rise, for the presence of a greater amount of sugar would produce a higher concentration of ions between the electrodes. This results in a higher conductivity between probes which, in turn, causes more current to flow through sensing resistors Rs and Rt. Conversely, lower brix values would decrease the output voltage on terminal 01. The difference in voltage between the reference voltage on potentiometer Rd and output 01 of the measuring circuit is representative of the error in brix, and is used to correct the amount of sugar being added to the beverage, a negative difference voltage representing too low a brix reading. Commonly in the art, and as taught by Howes, this difference is usually expressed as a voltage obtained by feeding both the reference and the sensed voltages to the inputs of a differential amplifier and thus obtaining a direct-current voltage.

Digital microprocessors do not operate on proportional, bipolar analog voltage signals; they require digital signals. Accordingly, the differential amplifier is eliminated in FIG. 6, wherein two identical analog-to-digital converters are employed in a parallel processing mode. The outputs of the converters are sent to the microprocessor which obtains the desired difference algebraically. The analog-to-digital converters produce outputs which are a digital number in binary (often hexadecimal) form, proportional to their input voltages to a high degree of precision. This approach removes a source of drift and gain-change-induced errors.

In FIG. 6, integrated circuits U1 and U2 represent the two identical analog-to-digital converters; U1 converts the reference voltage while U2 converts the output signal from the circuit of FIGS. 2 or 3. The arrows on the heavy lines connecting integrated circuits U1, U2 and U3 indicate signal flow, it being understood that terminals 01 and 02 are actually interconnected. Integrated circuit U3 represents the microprocessor which operates on the outputs of the analog-to-digital converters, and generates output signals which control the display module shown in the figure, causing it to show the percentage of charge, or ampere-hours remaining, as desired by the operator, or made to switch automatically between displays, using techniques well-known in the art. Typically, the display would be a liquid crystal display (LCD), or a light emitting diode (LED) display or the like. Microprocessor U3 can also generate an output signal, shown at its right side in the figure, which can be made proportional to charge state, for controlling a charger, for example. This output signal can either represent a binary or hexadecimal number that is displayed on the display and which decreases to zero at full charge, and which is directly proportional to charge deficiency. Alternatively, the displayed number controlled by the microprocessor could reach a maximum at full charge. Either signal can be generated regardless of whether reference potentiometer Rd is set to represent full charge or an exhausted battery by numerical manipulations in the microprocessor. For example, if resistor Rd is set high enough to represent full charge, or 100 percent, the number displayed can be made to represent charge deficiency by simple subtraction in the microprocessor, and vice-versa. If the charger requires an analog signal for control, the output signal from the microprocessor can be converted to an analog voltage by any one of several techniques known in the art.

The internal clock signal used in the microprocessor is also sent to integrated circuit U4, which contains a divider circuit to provide a sub-multiple pulse train for triggering the measuring circuit. The pulse train clock signal is sent to terminal N4, which is connected to terminal N3, or N1, depending upon the presence of the pulse driver of FIG. 4. Since clock pulse rates are in the vicinity of megapulses per second, and likely probe operating rates are in the vicinity of kilopulses per second, or less, the divider circuit could have a high number of stages if straightforward binary division is used. Instead, chains of dividers may be used; for example, three divide-by-ten counters concatenated would divide by ten cubed, or one thousand. In actual implementation hexadecimal division is preferred, hexadecimal computation being quite efficient in terms of stages required. Other techniques will undoubtedly suggest themselves to those skilled in the art.

Divider circuit U4 also contains means for generating gate pulses for enabling the analog-to-digital converters to sample input voltages, which can be synchronized to the pulse train or a submultiple thereof. Additionally, the gate pulses may be delayed so as to cause analog-to-digital converter U2 to sample the measuring circuit output voltage well after (or at least a predetermined time after) the square wave transitions and during the steady state, constant voltage which has been reached, such that the downward-going spikes on the output signal (see FIG. 5D) need not be filtered out. This not only speeds up availability of changes to the output signal, as discussed earlier, but also reduces cost and improves reliability by reducing discrete component count. Most importantly, it provides a measurement of steady state ion flow, taken well after delays caused by ion mobility limitations, and thus enables a more accurate result.

It is highly desirable that both analog-to-digital converters should be accurate, and as identical as possible. In cases requiring accuracy and precision beyond that attainable by using converters of the same manufacturing specification, which converters are selected to be matching, another technique is available: calibration. Both converters would be connected to a voltage source whose values are known to a high degree of accuracy, and deviations of converter outputs from the actual voltages, taken over the voltage range of interest, recorded. These would be stored in microprocessor U3 in look-up tables, which would be used by the microprocessor to correct the conversions. Thus, for example, should a converter read 3 millivolts low at an actual voltage of 1.000 volts, the microprocessor would add the equivalent of 3 millivolts when presented with an input signal of 0.997 volts. Each look-up table is an array of data points stored in digital form, in this case keyed in pairs. Each calibrated input value is paired with a corresponding actual value, or a correction, by techniques well known in the art. Techniques for interpolation between calibrated points may also be used, these also being well known to those versed in digital computation.

Changes in supply voltage Vs are reflected in the reference voltage on the moving tap of potentiometer Rd, as well as on the output voltage of the recombinant chopper measuring circuit. Thus, there exists an inherent tendency to compensate for such voltage changes. If closer compensation is required, the effects of the two saturated transistors in series with resistor Re, the probe, and resistors Rs and Rt, can be approximated by inserting a forward-conducting germanium diode between resistors R08 and Rd, or between the positive lead and resistor R08.

Howes proposes in his patent using the reference half bridge for temperature compensation of his battery hydrometer, which he must perform in order to determine specific gravity. He teaches the use of a temperature dependent resistor in one arm of the reference, more specifically, a solid glass bead thermistor responsive to the temperature of the battery's electrolyte. To match its change in resistance to that of the electrolyte, he employs a combination of series and shunt resistors which have low thermal coefficients of resistance.

It may be desired to determine and display the familiar battery figure of merit of specific gravity of the electrolyte. In order to calculate this quantity, it is necessary to measure electrolyte temperature accurately. It will often be useful to display electrolyte temperature.

Figure 7:
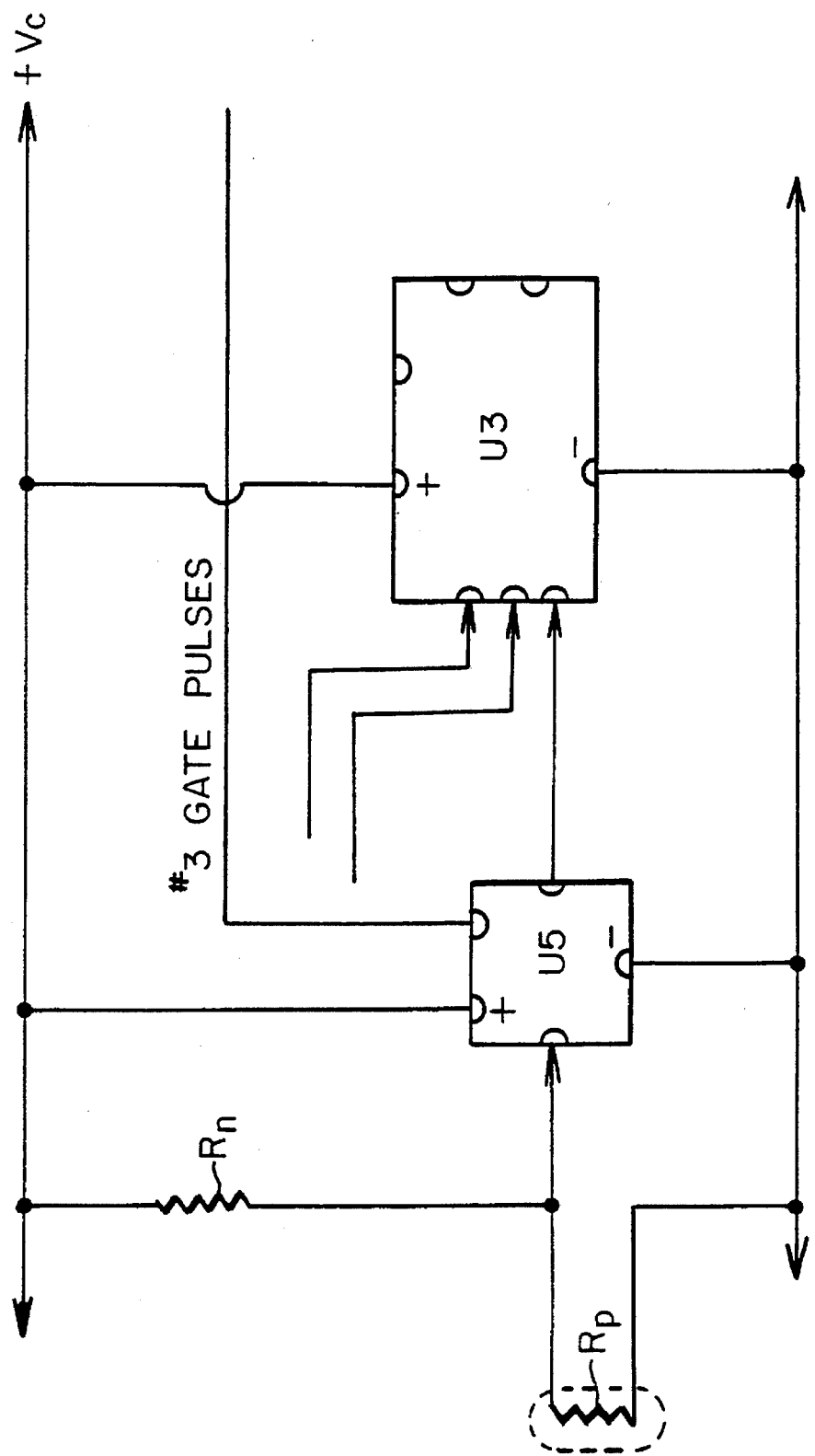
FIG. 7 is a block diagram of yet another portion of an electro-conductive fluid monitor formed in accordance with the present invention.

FIG. 7 illustrates the temperature measuring apparatus of the invention. A voltage divider comprising resistor Rn in series with thermosensitive resistor, Rp, has a voltage at their junction responsive to temperature changes of the electrolyte, resistor Rp being immersed in the electrolyte. Integrated circuit U5 is another analog-to-digital converter, as described earlier. It may be gated with separate gating pulses, as indicated in the figure. Alternatively, it may be gated by the same signal that gates either converter U1 or U2. Unless the temperature of the electrolyte changes very rapidly, it need not be gated as often as converters U1 and U2; a gate pulse every minute will often suffice. The output of analog-to-digital converter U5 is fed to a third input of microprocessor U3 so that the microprocessor may operate upon the numerical values representing the output of the recombinant chopper measuring circuit for thermal changes within the electrolyte in accordance with a thermal look-up table stored within microprocessor U3. If thermosensitive resistor Rp is a positive coefficient resistor, the output of converter U5 will be proportional to temperature. For example, the higher that the temperature of the electrolyte is, the higher the voltage processed by converter U5 will be. Alternatively, a resistor with a negative thermal coefficient could be used for resistor Rn and resistor Rn immersed in the electrolyte, where Rp would now be a fixed, non-thermally sensitive resistor; if resistor Rn's thermal coefficient is linear, the output signal will again be proportional to temperature. If a thermistor is used, it will tend to produce a digital array of values having large intervals at one end, diminishing to very small intervals at the other, because of the very large change of slope inherent in thermistor resistance characteristics when used over a wide range of temperature. Thus, with a fixed number of digits, the converted thermal voltage would suffer from a progressive loss of resolution as electrolyte temperatures climb.

All liquid electrolytes may be characterized as thermistors whose thermal behavior may be expressed mathematically, as disclosed in the inventor's master's thesis, An Investigation Into Liquid Electrolytic Thermistors, Clarkson Institute of Technology, 1952. Thus the mathematical formula of the battery electrolyte's thermally-caused changes in resistance can be determined by test, and a corresponding algorithm derived which can be stored in and used by the microprocessor rather than in the form of look-up tables. This approach benefits from the elimination of interpolation and furnishes higher resolution. Microprocessor U3 can be designed and programmed to cause the display of battery temperature and/or specific gravity upon demand by the operator, or automatically in rotation with percentage of charge remaining, ampere-hours remaining, and the like.

These methods may be applied to temperature compensation of the measuring and conditioning circuits, if they will be subjected to a wide range of temperatures. Little compensation will be required, for the invention has few analog voltages present. The circuit temperature sensing resistor could be in its own separate voltage divider, and have its own analog-to-digital converter and look-up table, as with the circuit of FIG. 6. However, it should usually suffice to place this sensing resistor within the reference voltage string comprising resistors R08 and Rd, and to compensate directly by affecting the reference voltage, as taught by Howes.

The recombinant chopper measuring circuits of FIGS. 2 and 3 may be converted to astable, free-running multivibrator recombinant choppers by use of standard regenerative feedback biasing known in the art. Diodes D1 through D4 would not be needed, unless it became desirable to synchronize the recombinant choppers to a submultiple of microprocessor U3's clock. A delay circuit (not shown), which is commonly a conventional one-shot multivibrator, driven by the astable chopper, would gate analog-to-digital converter U2, and even converter U1, late in the square wave pulse, as discussed earlier, to sample the output signal of the chopper circuit (i.e., the current through the test electrodes and electrolyte) when ion mobility has reached a steady state velocity. This occurs a predetermined time after transitions in the pulsed waveform applied to the electrodes. Except for not being synchronized to the microprocessor, it should be understood that operation of this variation would be essentially as described above, with no other apparent inherent strong advantages nor disadvantages. Component and circuit count would be closely similar to those previously described, substituting a delay one-shot multivibrator for divider U4 of FIG. 6, eliminating two diodes while requiring larger capacitors, and the like.

The three recombinant choppers described herein may be considered as a bridge of four switches, acting to turn on in alternating diagonally-opposite pairs and powered by a direct-current source, which is connected to the upper and lower nodes of the bridge through a series resistor, whereby a bipolar symmetrical square wave is caused to appear between midpoints of the bridge. This square wave signal is envisioned as being impressed upon the device under test which is connected to those same midpoints, the resistance of the device under test being relatively substantial such that changes in its resistance cause substantial and proportional changes in voltage across the series resistor. The switching elements could be relays or the like although, for attaining higher operating frequencies, semiconductor switches are preferred. A dedicated microprocessor system operates on the voltage across the series resistor, converting the voltage into digital form, comparing it to references, and causing the results to be displayed and to be used for control.

The present invention accurately monitors ion mobility in electro-conductive fluids, for example, electrolytes in lead-acid batteries. It does this on a real time basis using digital techniques. The preferred square wave test signal allows the ions in the electro-conductive fluid to reach a steady state velocity at which point the current through the electrodes and electro-conductive fluid is sampled, the sample signal then being processed by the microprocessor to provide an accurate indication of ion mobility in the electro-conductive fluid. The various signal generator circuits described herein provide astably or bistably the test signal to the electrodes without polarizing the electrodes. Also, no heavy filtering is required with the circuits and method of the present invention, and substantially no delay results in generating signals used for monitoring the ion mobility of electro-conductive fluid.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A method of monitoring ion mobility in an electro-conductive fluid, which comprises the steps of:
   immersing at least one pair of test electrodes at least partially in the electro-conductive fluid;
   generating a test signal having a pulsed waveform, the pulsed waveform of the test signal having an amplitude which remains constant for a predetermined time sufficient to ensure that ion mobility in the electro-conductive fluid has reached a steady state velocity;
   applying the test signal to the at least one pair of test electrodes to cause a current to flow through the test electrodes and the electro-conductive fluid; and
   sensing the current flow through the test electrodes and the electro-conductive fluid caused by the test signal, the sensed current being indicative of ion mobility in the electro-conductive fluid.

2. A method of monitoring the state of charge of a battery containing an electrolyte, which comprises:
   immersing at least one pair of test electrodes in the electrolyte;
   generating a test signal having a pulsed waveform, the pulsed waveform having a voltage which remains constant for a predetermined time sufficient to ensure that ion mobility in the electrolyte has reached a steady state velocity;
   applying the test signal to the at least one pair of test electrodes to thereby impress across the at least one pair of test electrodes an electromotive force of sufficient magnitude to cause ion movement in the electrolyte and a current to flow through the at least one pair of test electrodes and the electrolyte; and
   sensing the current flow through the at least one pair of test electrodes and the electrolyte caused by the electromotive force, the sensed current flow being indicative of the state of charge of the battery.

3. A method of monitoring ion mobility as defined by claim 1, wherein the step of sensing the current flow through the at least one pair of test electrodes further comprises sensing the current flow through the at least one pair of test electrodes during the predetermined time that the amplitude of the test signal is constant.

4. A method of monitoring ion mobility as defined by claim 1, wherein the step of generating a test signal having a pulsed waveform further comprises generating the test signal with a square wave waveform.

5. Apparatus for monitoring ion mobility in an electro-conductive fluid which comprises:
   at least one pair of test electrodes, the at least one pair of test electrodes being at least partially immersed in the electro-conductive fluid;

a signal generator, the signal generator generating a test signal having a pulsed waveform, the pulsed waveform of the test signal having a voltage which remains constant for a predetermined time sufficient to ensure that ion mobility in the electro-conductive fluid has reached a steady state velocity, the at least one pair of test electrodes being responsive to the test signal, the test signal causing a current to flow through the at least one pair of test electrodes and the electro-conductive fluid; and means for sensing the current flow through the at least one pair of test electrodes and the electro-conductive fluid caused by the test signal, the sensed current being indicative of ion mobility in the electro-conductive fluid.

6. Apparatus for monitoring ion mobility as defined by claim 5, wherein the signal generator is a square wave generator.

7. Apparatus for monitoring ion mobility as defined by claim 5, wherein the signal generator is a bistable multivibrator.

8. Apparatus for monitoring ion mobility as defined by claim 5, wherein the signal generator is an astable multivibrator.

* * * * *